(12) United States Patent
Miyamoto (10) Patent No.: US 9,023,685 B2
(45) Date of Patent: May 5, 2015

(54) SEMICONDUCTOR DEVICE, FABRICATION METHOD FOR THE SAME, AND DISPLAY APPARATUS

(75) Inventor: Mitsunobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/001,909

(22) PCT Filed: Feb. 22, 2012

(86) PCT No.: PCT/JP2012/001200
§ 371 (c)(1),
(2), (4) Date: Sep. 6, 2013

(87) PCT Pub. No.: WO2012/117695
PCT Pub. Date: Sep. 7, 2012

(65) Prior Publication Data
US 2013/0334528 A1  Dec. 19, 2013

(30) Foreign Application Priority Data

Feb. 28, 2011  (JP) .................. 2011-041345

(51) Int. Cl.
*H01L 21/26* (2006.01)
*H01L 29/786* (2006.01)
*H01L 27/12* (2006.01)
*H01L 29/417* (2006.01)
*H01L 29/26* (2006.01)
*H01L 29/66* (2006.01)
*G02F 1/1368* (2006.01)

(52) U.S. Cl.
CPC ........ *H01L 29/7869* (2013.01); *H01L 27/1225* (2013.01); *H01L 29/41733* (2013.01); *H01L 29/26* (2013.01); *G02F 1/1368* (2013.01); *G02F2001/13685* (2013.01); *H01L 29/66969* (2013.01)

(58) Field of Classification Search
CPC ............ H01L 29/7869; H01L 27/1225; H01L 29/41733; G02F 1/1368
USPC .................. 257/43, 59, 72; 438/104
See application file for complete search history.

(56) References Cited

U.S. PATENT DOCUMENTS

2008/0197350 A1 * 8/2008 Park et al. ................. 257/43
2010/0127266 A1   5/2010 Saito et al.
(Continued)

FOREIGN PATENT DOCUMENTS

JP       2010-123748 A    6/2010
(Continued)

OTHER PUBLICATIONS

Official Communication issued in International Patent Application No. PCT/JP2012/001200 mailed on May 1, 2012.

*Primary Examiner* — Tu-Tu Ho
(74) *Attorney, Agent, or Firm* — Keating & Bennett, LLP (57) ABSTRACT

A semiconductor device including a semiconductor layer, a plurality of electrode portions each overlapping the semiconductor layer, and an insulating film placed between the plurality of electrode portions to lie on the semiconductor layer is fabricated. The fabrication method includes the steps of: forming an oxide semiconductor layer part of which is covered with the insulating film; forming a conductive material layer to cover the oxide semiconductor layer and the insulating film; forming the plurality of electrode portions from the conductive material layer by photolithography and plasma dry etching, to expose part of the oxide semiconductor layer from the plurality of electrode portions and the insulating film; and removing the part of the oxide semiconductor layer exposed from the plurality of electrode portions and the insulating film to form the semiconductor layer.

4 Claims, 9 Drawing Sheets

(56) References Cited

U.S. PATENT DOCUMENTS

2010/0264412 A1 10/2010 Yamazaki et al.
2011/0012105 A1 1/2011 Yamazaki et al.
2012/0298990 A1 11/2012 Yamazaki et al.

FOREIGN PATENT DOCUMENTS

| JP | 2010-267955 A | 11/2010 |
| JP | 2011-40726 A | 2/2011 |
| KR | 10-2010-0094275 A | 8/2010 |

* cited by examiner

SEMICONDUCTOR DEVICE, FABRICATION METHOD FOR THE SAME, AND DISPLAY APPARATUS

TECHNICAL FIELD

The present disclosure relates to a semiconductor device, a fabrication method for the same, and a display apparatus.

BACKGROUND ART

In recent years, the development of flat-screen display apparatuses such as liquid crystal display apparatuses and organic EL display apparatuses has been advanced at a rapid pace. Such flat-screen display apparatuses often have an active matrix substrate where a switching element for driving a pixel is placed for each of a plurality of pixels for the purpose of enhancing the display quality.

The display apparatus has the above active matrix substrate and a counter substrate opposed to the active matrix substrate and bonded thereto via a frame-shaped sealing member. The display apparatus has a display region formed inside the sealing member, and also has a non-display region outside the periphery of the display region.

A thin film transistor (TFT), for example, as the switching element for each of a plurality of pixels is formed in a region of the active matrix substrate that is to serve as the display region. A semiconductor layer of the TFT was used to be formed of amorphous silicon (a-Si), etc. Recently, however, attempts have been made to form the semiconductor layer of an oxide semiconductor such as In—Ga—Zn—O (IGZO) in place of a-Si.

Such an oxide semiconductor, constructed by highly ionic bonding, is small in the difference in the mobility of electrons between its crystalline state and its amorphous state. Therefore, a comparatively high electron mobility is obtained even in the amorphous state.

Figure 25:
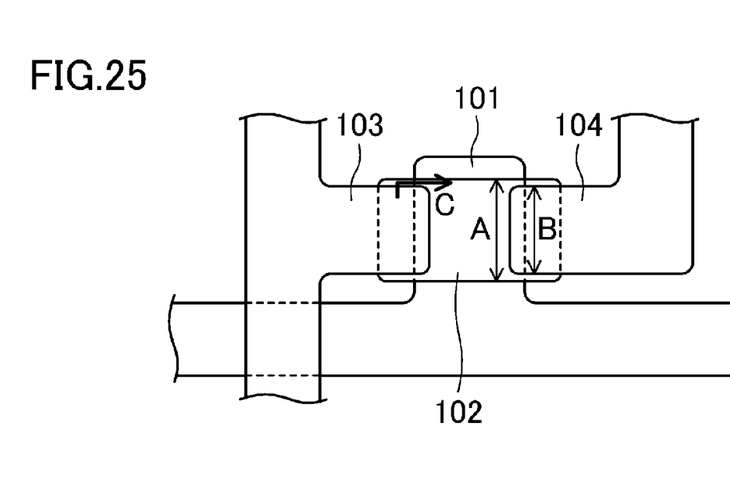
FIG. 25 is an enlarged plan view showing a configuration of a conventional bottom-gate type TFT.

Patent Document 1 discloses a bottom-gate type TFT. As shown in FIG. 25 that is an enlarged plan view, a TFT 100 includes: a gate electrode 101 formed on a substrate; a semiconductor layer 102 formed to cover the gate electrode 101 via a gate insulating film; a source electrode 103 overlapping the semiconductor layer 102 at one end of the semiconductor layer 102; and a drain electrode 104 overlapping the semiconductor layer 102 at the other end thereof. The gate electrode 101, the semiconductor layer 102, the source electrode 103, and the drain electrode 104 are individually formed into their predetermined shapes by photolithography and etching.

If the source electrode 103 and the drain electrode 104 are displaced at the time of photolithography protruding from the semiconductor layer 102, the overlap areas thereof with the semiconductor layer 102 will decrease, decreasing the channel width of the TFT 100.

To avoid the above problem, in order to keep the channel width constant even if the source electrode 103 and the drain electrode 104 are somewhat displaced, the width A of the semiconductor layer 102 in the channel width direction (vertical direction in FIG. 25) is made larger than the width B of the source electrode 103 and the drain electrode 104 in the channel width direction.

That is, the semiconductor layer 102 is formed wider than the source electrode 103 and the drain electrode 104 by the value of (width A−width B) as a superposition margin with the source electrode 103 and the drain electrode 104.

CITATION LIST

Patent Document

PATENT DOCUMENT 1: Japanese Patent Publication No. P2010-267955

SUMMARY OF THE INVENTION

Technical Problem

When the electrode portions such as the source electrode and the drain electrode are formed by plasma dry etching, the portion of the semiconductor layer made of an oxide semiconductor exposed from the electrode portions may be altered to have conductivity due to the reduction action of the plasma.

As a result, there is the possibility that the above electrode portions that should be electrically insulated from each other may be electrically connected to each other via the altered portion of the semiconductor layer, and as shown by arrow C in FIG. 25, for example, a leakage current may occur in the altered portion.

In order to address the above problem, it is an objective of the present disclosure to significantly reduce the occurrence of a leakage current while forming a semiconductor layer constituting a semiconductor device using an oxide semiconductor.

Solution to the Problem

In order to attain the above objective, the fabrication method for a semiconductor device according to the present disclosure is related to a method for fabricating a semiconductor device including a semiconductor layer, a plurality of electrode portions each overlapping the semiconductor layer, and an insulating film placed between the plurality of electrode portions to lie on the semiconductor layer.

The fabrication method includes: a first step of forming an island-shaped oxide semiconductor layer part of which is covered with the insulating film; a second step of forming a conductive material layer to cover the oxide semiconductor layer and the insulating film; a third step of forming the plurality of electrode portions from the conductive material layer by photolithography and plasma dry etching, to expose part of the oxide semiconductor layer from the plurality of electrode portions and the insulating film; and a fourth step of removing the part of the oxide semiconductor layer exposed from the plurality of electrode portions and the insulating film to form the semiconductor layer.

Advantages of the Invention

According to the present disclosure, while the semiconductor layer constituting the semiconductor device is made of an oxide semiconductor, such a semiconductor layer is formed to lie under the electrode portions and the insulating film so as not to protrude therefrom. Therefore, the semiconductor layer is avoided from having a conductive portion altered from the oxide semiconductor layer due to the reduction action, and thus occurrence of a leakage current can be significantly reduced.

DESCRIPTION OF EMBODIMENTS

Embodiments of the present disclosure will be described hereinafter with reference to the accompanying drawings. It should be noted that the present disclosure is not limited to the embodiments to follow.

<Embodiment 1>

FIGS. 1-18 illustrate Embodiment 1 of the present disclosure.

Figure 1:
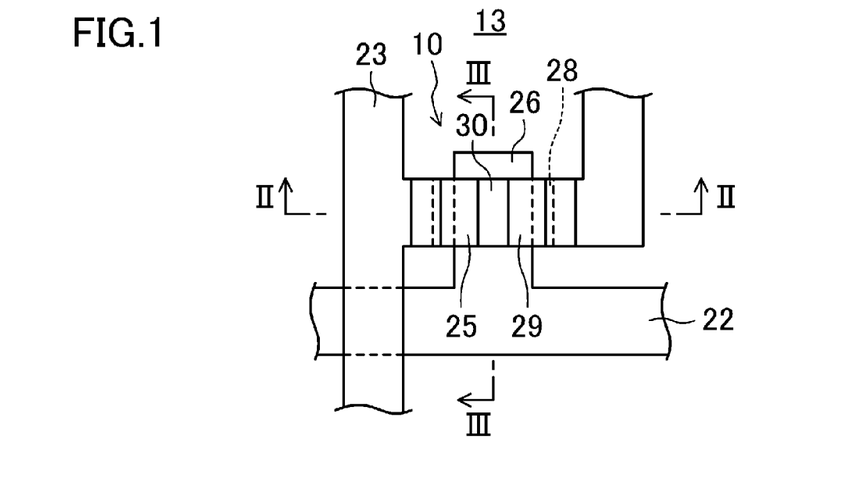
FIG. 1 is an enlarged plan view showing a TFT in Embodiment 1.
Figure 2:
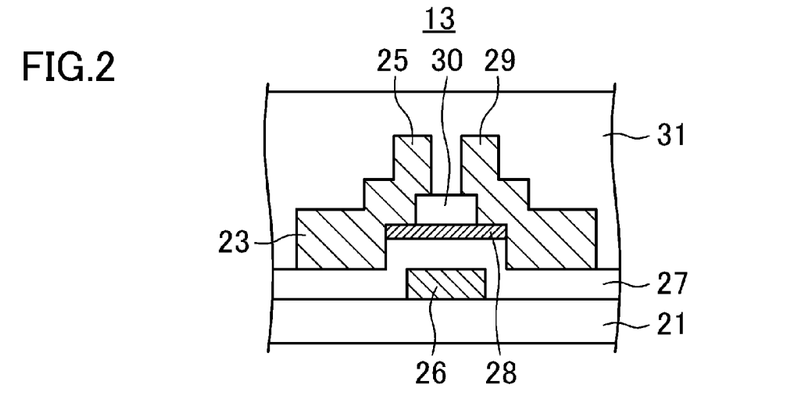
FIG. 2 is a cross-sectional view taken along line II-II in FIG. 1.
Figure 3:
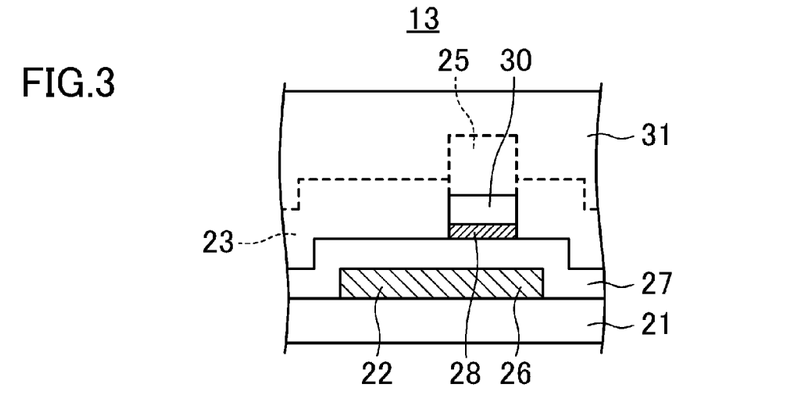
FIG. 3 is a cross-sectional view taken along line III-III in FIG. 1.
Figure 16:
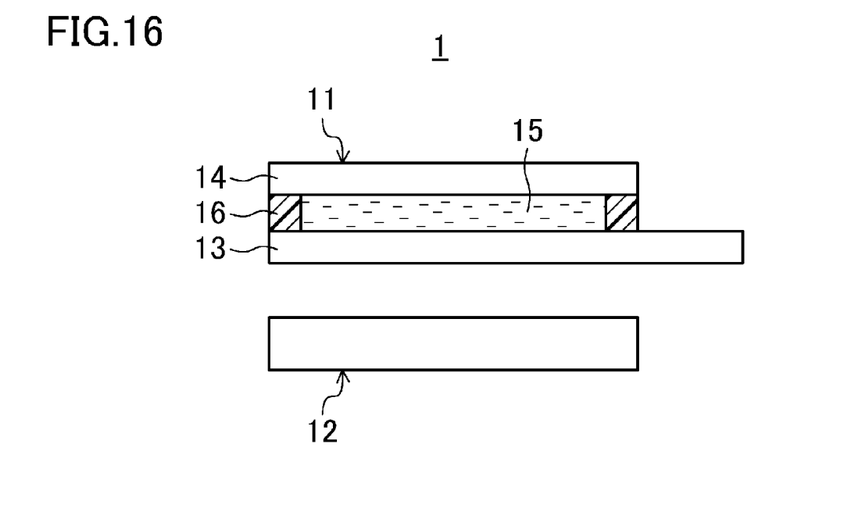
FIG. 16 is a cross-sectional view showing a schematic configuration of a liquid crystal display apparatus in Embodiment 1.

FIG. 1 is an enlarged plan view showing a TFT 10 in Embodiment 1, FIG. 2 is a cross-sectional view taken along line II-II in FIG. 1, and FIG. 3 is a cross-sectional view taken along line III-III in FIG. 1. FIG. 16 is a cross-sectional view showing a schematic configuration of a liquid crystal display apparatus 1 in Embodiment 1.

In this embodiment, the thin film transistor (TFT) 10 will be described as an example of the semiconductor device. Also, the liquid crystal display apparatus 1 having a plurality of such TFTs will be described as an example of the display apparatus.

As shown in FIG. 16, the liquid crystal display apparatus 1 includes: a liquid crystal display panel 11; a backlight unit 12 as a light source placed on the back-face side of the liquid crystal display panel 11; and a casing (not shown) that houses these. That is, the liquid crystal display apparatus 1 is configured to perform at least transmissive display by selectively transmitting light from the backlight unit 12.

The liquid crystal display panel 11 has a TFT substrate 13 as the first substrate and a counter substrate 14 as the second substrate opposed to the TFT substrate 13, as shown in FIG. 16. A liquid crystal layer 15 is sealed between the TFT substrate 13 and the counter substrate 14 by a sealing member 16.

The liquid crystal display panel 11 has a display region (illustration omitted) and a frame-shaped non-display region (illustration omitted) surrounding the display region. In the display region, a plurality of pixels are arranged in a matrix. The pixel as used herein refers to the minimum unit for control of display.

The TFT substrate 13 is comprised of an active matrix substrate. As shown in FIGS. 1 to 3, the TFT substrate 13 has a glass substrate 21 as a transparent substrate. On the glass substrate 21, formed are a plurality of gate interconnects 22 extending in parallel with one another and a plurality of source interconnects 23 extending to intersect the gate interconnects 22.

That is, the gate interconnects 22 and the source interconnects 23 are formed in a lattice shape as a whole, and a pixel is formed in each of rectangular regions surrounded by the gate interconnects 22 and the source interconnects 23. The gate interconnects 22 and the source interconnects 23 are formed of a single-layer film made of one kind, or a multilayer film made of a plurality of kinds, selected from Al, Cu, Mo, Ti, etc., for example.

In each pixel, the TFT 10 is provided at a position near each of the intersections of the gate interconnects 22 and the source interconnects 23. The TFT 10 includes: a source electrode 25 as an electrode portion branching from the corresponding source interconnect 23; a gate electrode 26 branching from the corresponding gate interconnect 22; a semiconductor layer 28 opposed to the gate electrode 26 via a gate insulating film 27; and a drain electrode 29 as an electrode portion placed with a predetermined spacing from the source electrode 25.

As shown in FIGS. 2 and 3, the gate electrode 26 and the gate interconnect 22 are covered with the gate insulting film 27, which is formed of a single-layer film made of one kind, or a multilayer film made of a plurality of kinds, selected from $SiN_x$ (silicon nitride), $SiO_2$, etc., for example. The semiconductor layer 28 is formed into a rectangular island shape, for example, on the surface of the gate insulating film 27. The semiconductor layer 28 is formed of an oxide semiconductor such as IGZO, for example.

On the semiconductor layer 28, the source electrode 25 and the drain electrode 29 are formed to overlap the semiconductor layer 28. On the surface of the semiconductor layer 28, also, a channel protection film 30 as the insulating film is placed between the source electrode 25 and the drain electrode 29 to lie on part of the semiconductor layer 28. The channel protection film 30 is formed of $SiN_x$, $SiO_2$, etc., for example.

The source electrode 25 and the drain electrode 29 also cover part of the channel protection film 30. These channel protection film 30, source electrode 25, drain electrode 29, etc. are covered with an interlayer insulating film 31 as a protection film. The interlayer insulating film 31 is formed of $SiN_x$, etc., for example.

A pixel electrode (illustration omitted) connected to the drain electrode 29 is placed in each pixel. The pixel electrode is formed on the surface of the interlayer insulating film 31 and formed of a transparent conductive film made of ITO, etc., for example. In the counter substrate 14, formed is a common electrode (illustration omitted) provided in common for the plurality of pixel electrodes. Like the pixel electrodes, the common electrode is also formed of a transparent conductive film made of ITO, etc. for example.

As shown in FIGS. 1 and 3, the entirety of the semiconductor layer 28 lies under any of the source electrode 25, the drain electrode 29, and the channel protection film 30. In other words, as shown in FIG. 1, the semiconductor layer 28 is formed not to protrude from the source electrode 25, the drain electrode 29, and the channel protection film 30. Also, the side faces of part of the semiconductor layer 28 are flush with part of the side faces of the source electrode 25, the drain electrode 29, and the channel protection film 30, constituting one plane.

-Fabrication Method-

Next, a fabrication method for the TFT 10 and the liquid crystal display apparatus 1 described above will be described.

The liquid crystal display apparatus 1 is fabricated in the following manner: the TFT substrate 13 fabricated by forming a plurality of TFTs 10, etc. and the counter substrate 14 fabricated by forming the common electrode, etc. are bonded together via the liquid crystal layer 15 and the sealing member 16, to fabricate the liquid crystal display panel 11, and the backlight unit 12 is opposed to the resultant liquid crystal display panel 11.

The fabrication method for the TFT 10 will be described hereinafter with reference to FIGS. 4 to 15.

Figure 4:
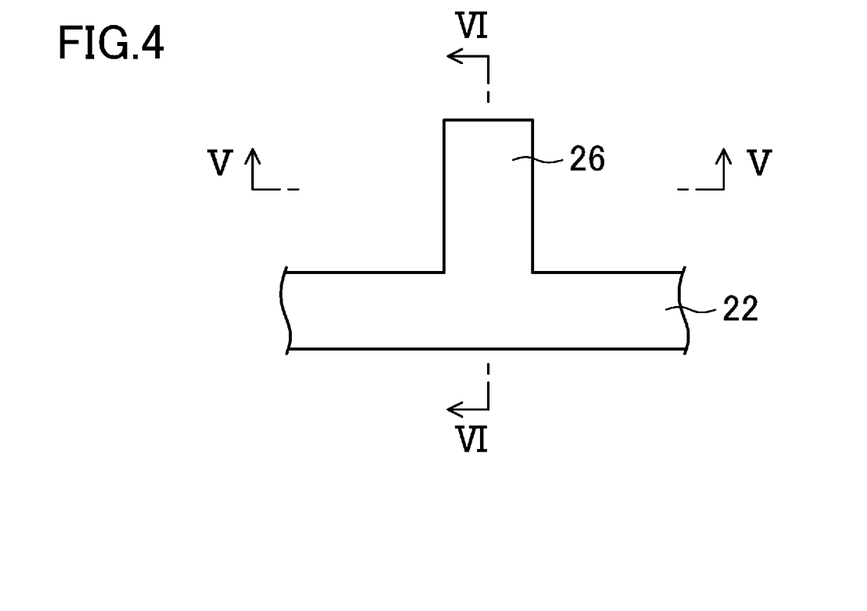
FIG. 4 is a plan view showing a gate electrode formed on a substrate.
Figure 5:
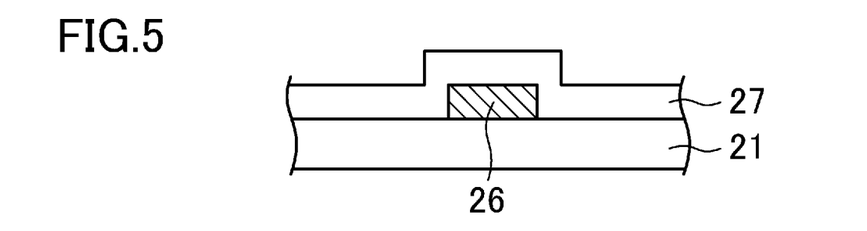
FIG. 5 is a cross-sectional view taken along line V-V in FIG. 4.
Figure 6:
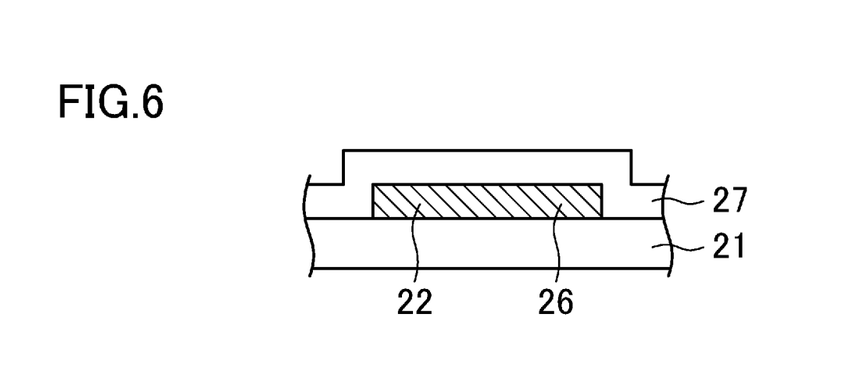
FIG. 6 is a cross-sectional view taken along line VI-VI in FIG. 4.

FIG. 4 is a plan view showing the gate electrode 26 formed on the substrate, FIG. 5 is a cross-sectional view taken along line V-V in FIG. 4, and FIG. 6 is a cross-sectional view taken along line VI-VI in FIG. 4.

First, as shown in FIGS. 4 to 6, a conductive material layer (not shown) made of Mo, for example, is formed uniformly on the entirety of the glass substrate 21 as a transparent substrate, and then subjected to a photolithography process and an etching process, thereby forming the gate interconnect 22 and the gate electrode 26.

The conductive material layer is not limited to a single layer of Mo, but may be a single-layer film made of one kind, or a multilayer film made of a plurality of kinds, selected from Al, Cu, Mo, Ti, etc., for example.

Subsequently, an $SiO_2$ film, for example, is formed on the glass substrate 21 to a thickness of about 350 nm by CVD to cover the gate interconnect 22 and the gate electrode 26, thereby forming the gate insulating film 27. The gate insulating film 27 is not limited to the $SiO_2$ film, but may be formed of a single-layer film made of one kind, or a multilayer film made of a plurality of kinds, selected from $SiN_x$ (silicon nitride), $SiO_2$, etc., for example.

Figures 7, 8:
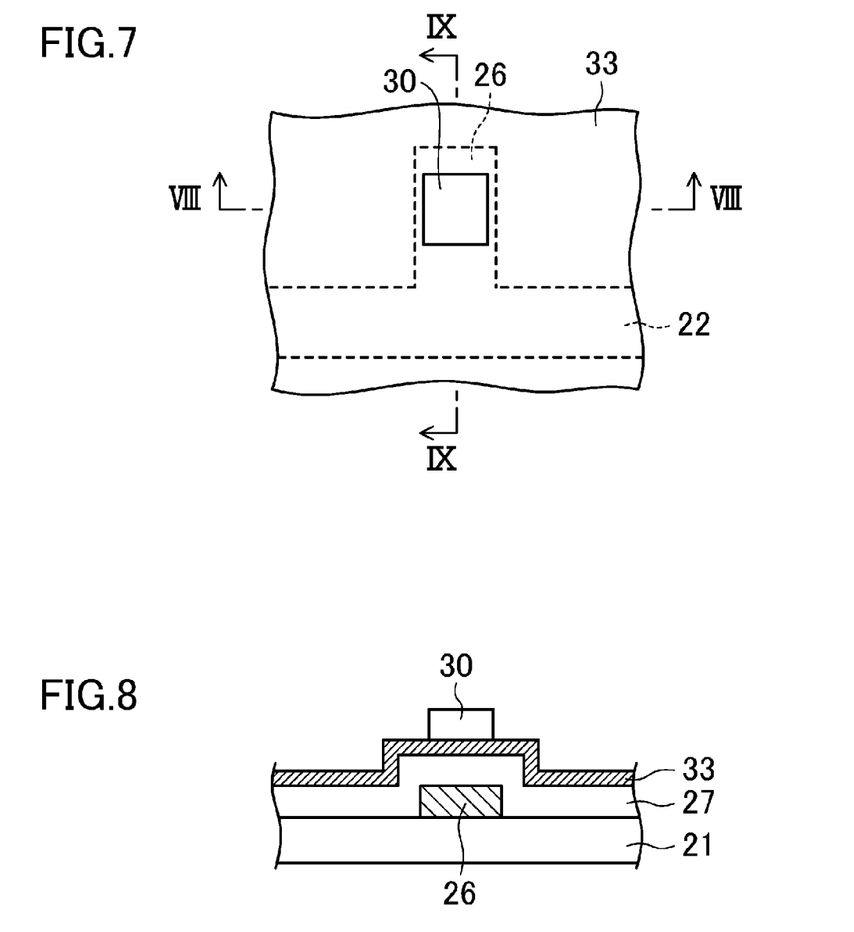
FIG. 7 is a plan view showing an oxide semiconductor layer and a channel protection film formed on the substrate.
FIG. 8 is a cross-sectional view taken along line VIII-VIII in FIG. 7.
Figure 9:
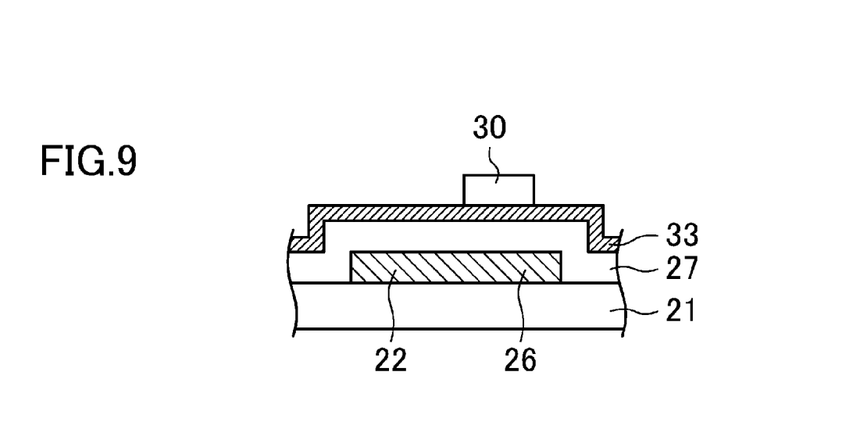
FIG. 9 is a cross-sectional view taken along line IX-IX in FIG. 7.

Next, as shown in FIGS. 7 to 12, an oxide semiconductor layer 32, 33 part of which is covered with the channel protection film 30 is formed. FIG. 7 is a plan view showing the oxide semiconductor layer 33 and the channel protection film 30 formed on the substrate, FIG. 8 is a cross-sectional view taken along line VIII-VIII in FIG. 7, and FIG. 9 is a cross-sectional view taken along line IX-IX in FIG. 7.

Figure 10:
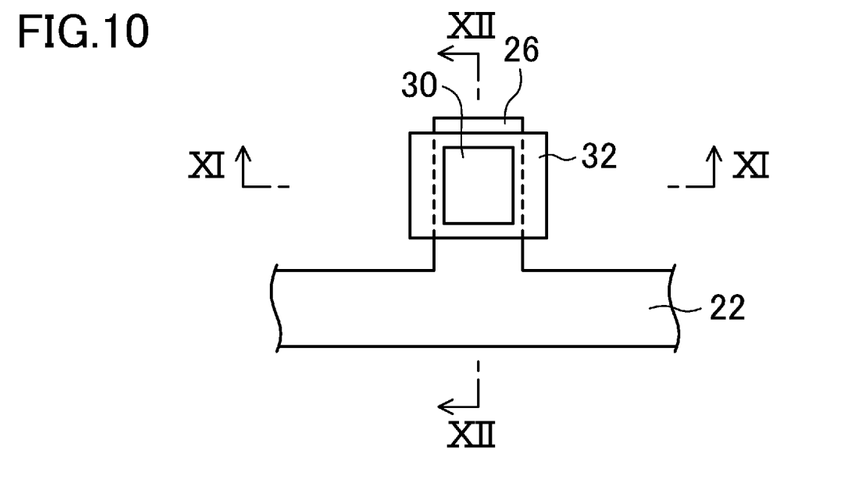
FIG. 10 is a plan view showing an oxide semiconductor layer in a predetermined shape formed on the substrate.
Figure 11:
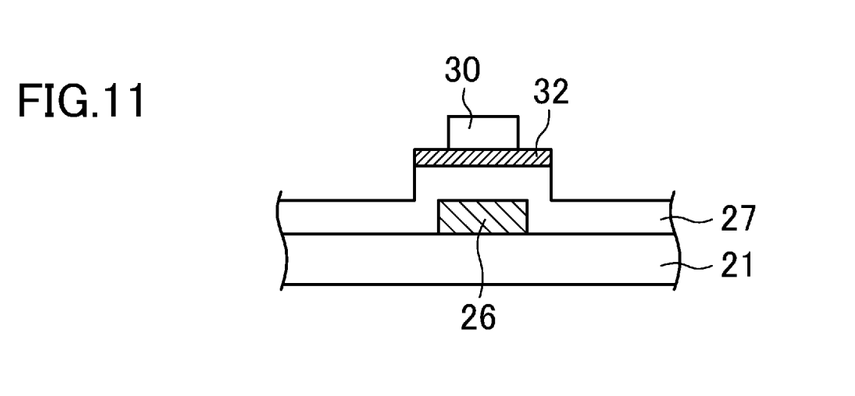
FIG. 11 is a cross-sectional view taken along line XI-XI in FIG. 10.
Figure 12:
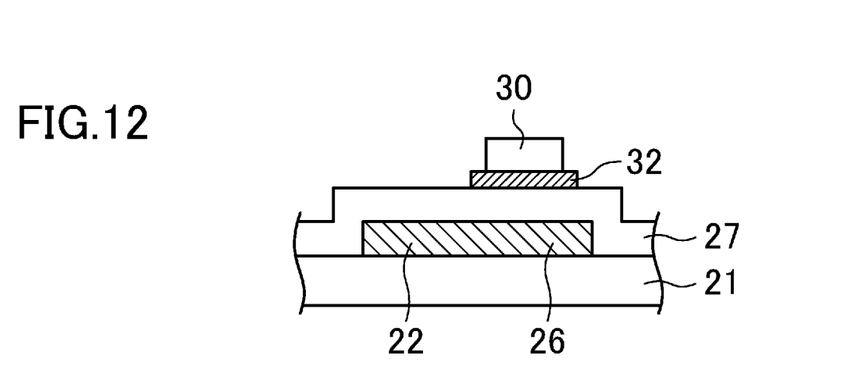
FIG. 12 is a cross-sectional view taken along line XII-XII in FIG. 10.

FIG. 10 is a plan view showing the oxide semiconductor layer 32 in a predetermined shape formed on the substrate, FIG. 11 is a cross-sectional view taken along line XI-XI in FIG. 10, and FIG. 12 is a cross-sectional view taken along line XII-XII in FIG. 10.

In the first step, as shown in FIGS. 7 to 9, the oxide semiconductor layer 33 made of IGZO, for example, is formed on the entire surface of the gate insulating film 27 to a thickness of about 50 nm by sputtering. Subsequently, an insulating material layer (illustration omitted) made of $SiO_2$, for example, is formed on the surface of the oxide semiconductor layer 33 to a thickness of about 200 nm by CVD. Thereafter, the insulating material layer is subjected to a photolithography process and an etching process thereby forming the channel protection film 30 having a predetermined shape. The channel protection film 30 is formed into a rectangular shape, for example, and placed to lie above the center of the gate electrode 26.

Thereafter, as shown in FIGS. 10 to 12, the oxide semiconductor layer 33 is subjected to a photolithography process and an etching process thereby forming the island-shaped oxide semiconductor layer 32. The oxide semiconductor layer 32 is formed into a rectangular shape, for example, to stride the gate electrode 26, and also formed so that the channel protection film 30 covers the center of the oxide semiconductor layer 32. In other words, at this time, the oxide semiconductor layer 32 protrudes from the periphery of the channel protection film 30.

In the second step, a conductive material layer (illustration omitted) is formed to cover the oxide semiconductor layer 32 and the channel protection film 30. The conductive material layer is formed by stacking a Ti layer as a lower layer (illustration omitted) having a thickness of about 100 nm and then an Al layer as an upper layer (illustration omitted) having a thickness of about 300 nm, for example. Note that each layer of the conductive material layer may be formed of a single-layer film made of one kind, or a multilayer film made of a plurality of kinds, selected from Al, Cu, Mo, Ti, etc., for example.

Figure 13:
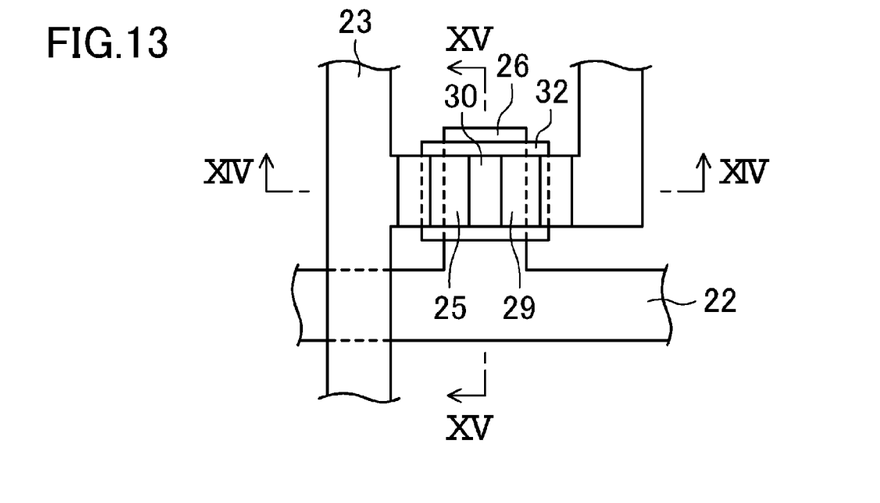
FIG. 13 is a plan view showing a source electrode and a drain electrode covering part of the oxide semiconductor layer.
Figure 14:
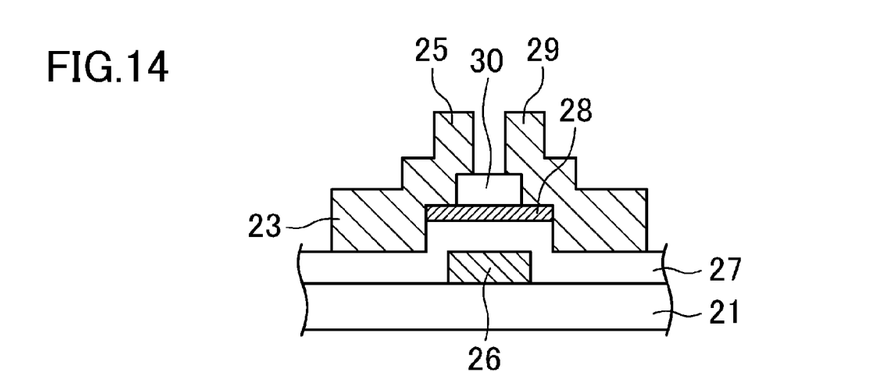
FIG. 14 is a cross-sectional view taken along line XIV-XIVI in FIG. 13.
Figure 15:
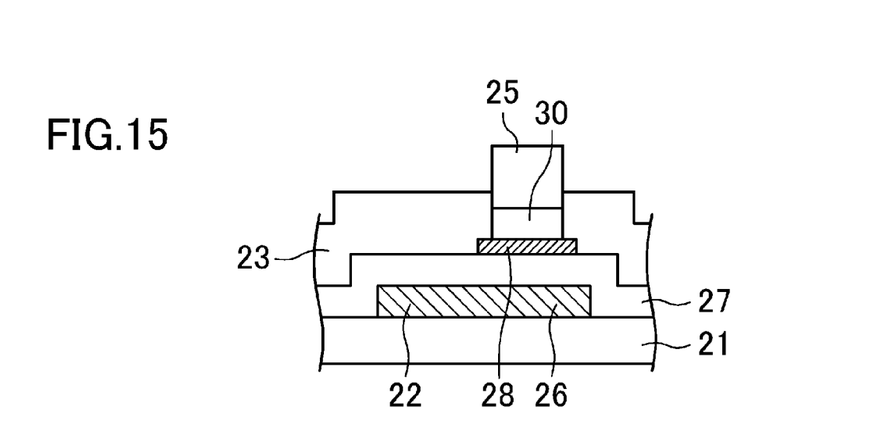
FIG. 15 is a cross-sectional view taken along line XV-XV in FIG. 13.

In the third step, as shown in FIGS. 13 to 15, the conductive material layer is subjected to a photolithography process and a plasma dry etching process to from the source interconnect 23, the source electrode 25, and the drain electrode 29 from the conductive material layer, whereby part of the oxide semiconductor layer 32 is exposed from the source electrode 25, the drain electrode 29, and the channel protection film 30.

FIG. 13 is a plan view showing the source electrode 25 and the drain electrode 29 covering part of the oxide semiconductor layer 32, FIG. 14 is a cross-sectional view taken along line XIV-XIV in FIG. 13, and FIG. 15 is a cross-sectional view taken along line XV-XV in FIG. 13.

The source electrode 25 and the drain electrode 29 are formed so that the width of the oxide semiconductor layer 32 in the direction orthogonal to the direction in which the source electrode 25 and the drain electrode 29 face each other (i.e., the vertical direction in FIG. 13) is larger than the width of the source electrode 25 and the drain electrode 29 and the width of the channel protection film 30.

The reason why part of the oxide semiconductor layer 32 is exposed from the source electrode 25, the drain electrode 29, and the channel protection film 30 is that the oxide semiconductor layer 32 is formed wider beforehand to secure a superposition margin between the channel protection film 30 and the source and drain electrodes 25 and 29. The exposed portions of the oxide semiconductor layer 32 become rendered conductive due to the reduction action in the plasma treatment in the above plasma dry etching process.

Figure 17:
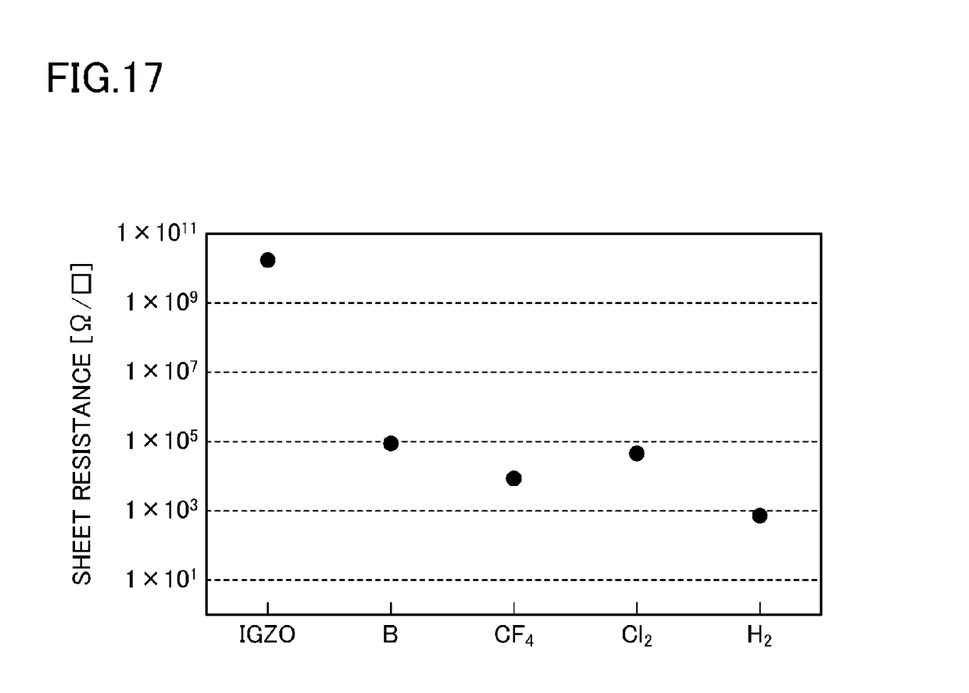
FIG. 17 is a graph showing the sheet resistance values of an oxide semiconductor before and after plasma treatment.

FIG. 17 is a graph showing the sheet resistance values of IGZO as the oxide semiconductor before and after the plasma treatment. As shown in FIG. 17, while the sheet resistance value of IGZO before the plasma treatment is $1\times10^{10}$ ω/□ or more, which is comparatively large, it widely decreases after the plasma treatment using each of B, $CF_4$, $Cl_2$, and $H_2$, which is $1\times10^5$ ω/□ or less.

In the fourth step, as shown in FIGS. 1 to 3, the portions of the oxide semiconductor layer 32 exposed from the source electrode 25, the drain electrode 29, and the channel protection film 30 are removed, to form the semiconductor layer 28.

The partial removal of the oxide semiconductor layer 32 is performed by wet etching using oxalic acid, for example. By this removal, the side faces of the semiconductor layer 28 become flush with part of the side faces of the source electrode 25, the drain electrode 29, and the channel protection film 30, constituting the same plane.

Thereafter, $SiN_x$ is deposited to a thickness of about 250 nm by CVD to cover the semiconductor layer 28, the source electrode 25, the drain electrode 29, and the channel protection film 30, to form the interlayer insulating film 31 as a protection film. In this way, the TFT 10 is fabricated.

-Effect of Embodiment 1-

Figure 18:
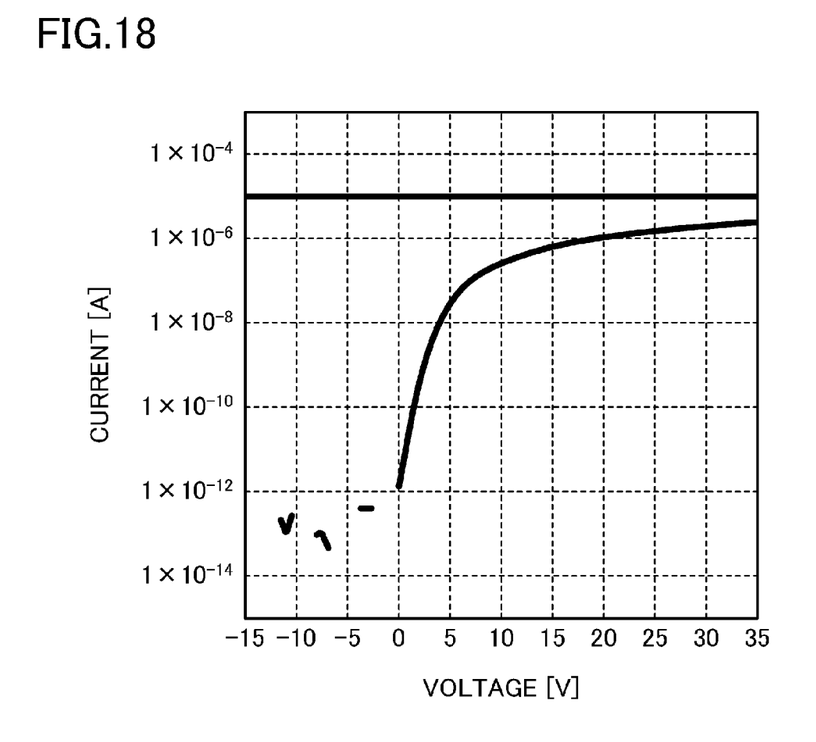
FIG. 18 is a graph showing the TFT characteristics in a practical example and a comparative example.

FIG. 18 is a graph showing the TFT characteristics in a practical example and a comparative example. In the comparative example, the characteristic of a TFT with the portions of the oxide semiconductor layer 32 exposed from the source electrode 25, the drain electrode 29, and the channel protection film 30 left unremoved is shown. In the practical example, as described in Embodiment 1, the characteristic of the TFT 10 with the exposed portions of the oxide semiconductor layer 32 removed is shown.

As shown in FIG. 18, in the comparative example, it is found that a constant current flows irrespective of the TFT being on or off, causing a leakage current between the source electrode and the drain electrode. By contrast, in the practical example, it is found that the current is very small when the TFT 10 is off.

As described above, in Embodiment 1, while the semiconductor layer 28 constituting the bottom-gate type TFT 10 is made of an oxide semiconductor such as IGZO excellent in electron mobility, etc., such a semiconductor layer 28 is formed to lie under any of the source electrode 25, the drain electrode 29, and the channel protection film 30 so as not to protrude therefrom. Therefore, the semiconductor layer 28 is avoided from having a conductive portion altered from the oxide semiconductor layer 32 due to the reduction action, and thus occurrence of a leakage current can be significantly reduced.

<Embodiment 2>

Figure 19:
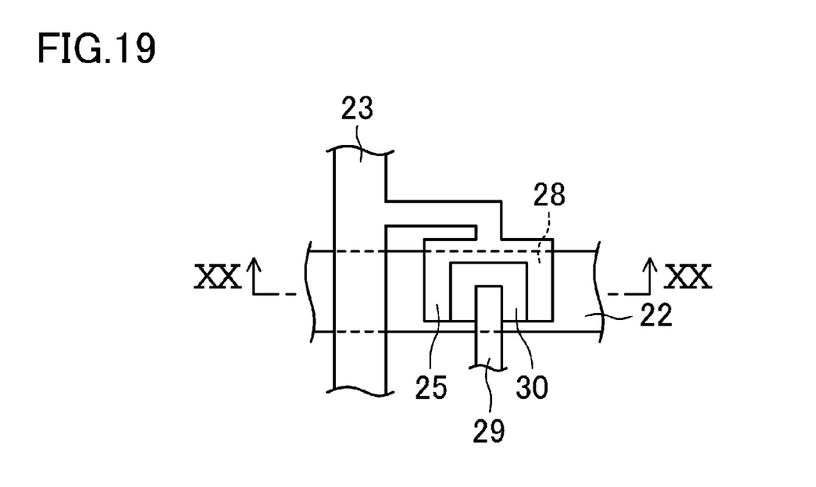
FIG. 19 is an enlarged plan view showing a TFT in Embodiment 2.
Figure 20:
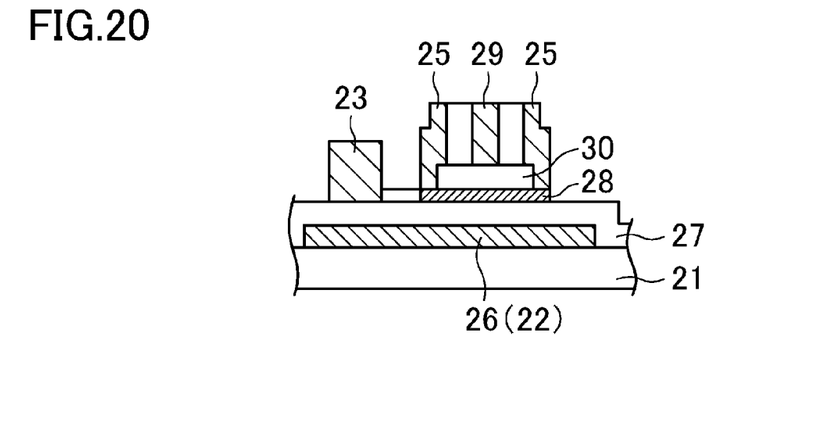
FIG. 20 is a cross-sectional view taken along line XX-XX in FIG. 19.
Figure 21:
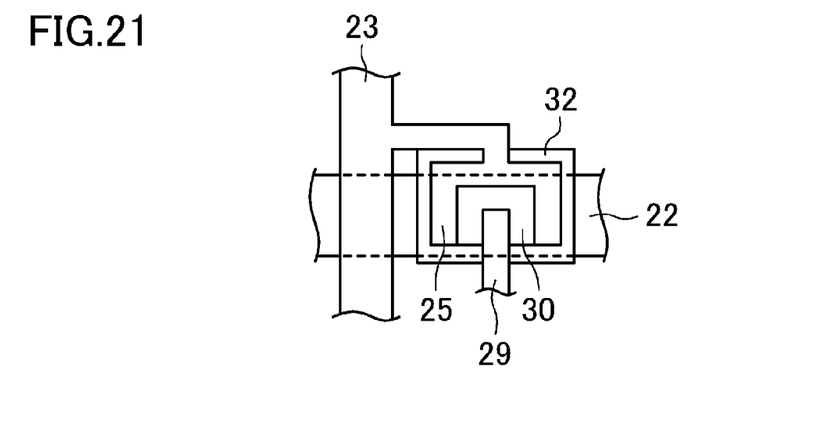
FIG. 21 is a plan view showing a source electrode and a drain electrode covering part of an oxide semiconductor layer.

FIGS. 19 to 21 show Embodiment 2 of the present invention.

FIG. 19 is an enlarged plan view showing a TFT 10 in Embodiment 2, FIG. 20 is a cross-sectional view taken along line XX-XX in FIG. 19, and FIG. 21 is a plan view showing a source electrode 25 and a drain electrode 29 covering part of an oxide semiconductor layer 32. In this and subsequent embodiments, like components as those in FIGS. 1 to 18 are denoted by the same reference numerals, and description of such components is omitted. While the source electrode 25 and the drain electrode 29 are placed in line in a given linear direction in the TFT 10 in Embodiment 1, the source electrode 25 is formed into a U shape in the TFT 10 in Embodiment 2.

The TFT 10 in this embodiment is formed in a TFT substrate 13 constituting a liquid crystal display panel 11, as in Embodiment 1. As shown in FIG. 19, a gate electrode 26 in this embodiment is formed of a portion of a gate interconnect 22 extending linearly. The gate electrode 26 and the gate interconnect 22 are formed of a single-layer film made of one kind, or a multilayer film made of a plurality of kinds, selected from Al, Cu, Mo, Ti, etc., for example.

A semiconductor layer 28 is formed in a rectangular island shape, for example, on the surface of a gate insulating film 27 covering the gate interconnect 22 and the gate electrode 26. The gate insulating film 27 is formed of a single-layer film made of one kind, or a multilayer film made of a plurality of kinds, selected from $SiN_x$, $SiO_2$, etc., for example.

On the semiconductor layer 28, the source electrode 25 and the drain electrode 29 are formed to overlap the semiconductor layer 28. The source electrode 25 branches from a source interconnect 23, and further the top portion thereof branches into two forming a U shape. The drain electrode 29 is formed linearly and placed inside the U-shaped portion of the source electrode 25.

On the surface of the semiconductor layer 28, also, a channel protection film 30 as the insulating film is placed between the source electrode 25 and the drain electrode 29 to lie on part of the semiconductor layer 28. The channel protection film 30 is formed of $SiN_x$, $SiO_2$, etc., for example.

The source electrode 25 and the drain electrode 29 also cover part of the channel protection film 30. These channel protection film 30, source electrode 25, drain electrode 29, etc. are covered with an interlayer insulating film (illustration omitted) as a protection film. The interlayer insulating film is formed of $SiN_x$, etc., for example.

As shown in FIGS. 19 and 20, the entirety of the semiconductor layer 28 lies under any of the source electrode 25, the drain electrode 29, and the channel protection film 30. In other words, as shown in FIG. 19, the semiconductor layer 28 is formed so as not to protrude from the source electrode 25, the drain electrode 29, and the channel protection film 30. Also, the side faces of part of the semiconductor layer 28 are flush with part of the side faces of the source electrode 25, the drain electrode 29, and the channel protection film 30, constituting one plane.

-Fabrication Method-

Next, the fabrication method for the above-described TFT 10 and the liquid crystal display apparatus 1 will be described.

As in Embodiment 1 described above, the liquid crystal display apparatus 1 is fabricated in the following manner: a TFT substrate 13 fabricated by forming a plurality of TFTs 10, etc. and a counter substrate 14 fabricated by forming a common electrode, etc. are bonded together via a liquid crystal layer 15 and a sealing member 16, to fabricate a liquid crystal display panel 11, and a backlight unit 12 is opposed to the resultant liquid crystal display panel 11.

In fabrication of the TFT 10, as in Embodiment 1, a conductive material layer (not shown) made of Mo, for example, is formed uniformly on the entirety of a glass substrate 21 as a transparent substrate, and then subjected to a photolithography process and an etching process, thereby forming the gate interconnect 22 and the gate electrode 26.

The conductive material layer is not limited to a single layer of Mo, but may be a single-layer film made of one kind, or a multilayer film made of a plurality of kinds, selected from Al, Cu, Mo, Ti, etc., for example.

Subsequently, an $SiO_2$ film, for example, is formed on the glass substrate 21 to a thickness of about 350 nm by CVD to cover the gate interconnect 22 and the gate electrode 26, thereby forming the gate insulating film 27. The gate insulating film 27 is not limited to the $SiO_2$ film, but may be formed of a single-layer film made of one kind, or a multilayer film made of a plurality of kinds, selected from $SiN_x$ (silicon nitride), $SiO_2$, etc., for example.

Next, an oxide semiconductor layer 32 in a predetermined shape part of which is covered with a channel protection film 30 is formed. In the first step, an oxide semiconductor layer (illustration omitted) made of IGZO, for example, is formed on the entire surface of the gate insulating film 27 to a thickness of about 50 nm by sputtering. Subsequently, an insulating material layer (illustration omitted) made of $SiO_2$, for example, is formed on the surface of the oxide semiconductor layer to a thickness of about 200 nm by CVD. Thereafter, the insulating material layer is subjected to a photolithography process and an etching process to form the channel protection film 30 in a predetermined shape. The channel protection film 30 is formed into a rectangular shape, for example, and placed to lie above the center of the gate electrode 26.

Thereafter, as shown in FIG. 21, the oxide semiconductor layer is subjected to a photolithography process and an etching process to form the island-shaped oxide semiconductor layer 32. The oxide semiconductor layer 32 is formed into a rectangular shape, for example, to stride the gate electrode 26 and also formed so that the channel protection film 30 covers the center of the oxide semiconductor layer 32. In other words, at this time, the oxide semiconductor layer 32 protrudes from the periphery of the channel protection film 30.

In the second step, a conductive material layer (illustration omitted) is formed to cover the oxide semiconductor layer 32 and the channel protection film 30. The conductive material layer is formed by stacking a Ti layer as a lower layer (illustration omitted) having a thickness of about 100 nm and then an Al layer as an upper layer (illustration omitted) having a thickness of about 300 nm, for example. Note that each layer of the conductive material layer may be formed of a single-layer film made of one kind, or a multilayer film made of a plurality of kinds, selected from Al, Cu, Mo, Ti, etc., for example.

In the third step, as shown in FIG. 21, the conductive material layer is subjected to a photolithography process and a plasma dry etching process to form the source interconnect 23, the U-shaped source electrode 25, and the drain electrode 29 from the conductive material layer, whereby part of the oxide semiconductor layer 32 is exposed from the source electrode 25, the drain electrode 29, and the channel protection film 30.

The reason why part of the oxide semiconductor layer 32 is exposed from the source electrode 25, the drain electrode 29, and the channel protection film 30 is that the oxide semiconductor layer 32 is formed wider beforehand to secure a superposition margin between the oxide semiconductor layer 32 and the source and drain electrodes 25 and 29. The exposed portions of the oxide semiconductor layer 32 are rendered conductive due to the reduction action in the plasma treatment in the above plasma dry etching process.

In the fourth step, as shown in FIGS. 19 and 20, the portions of the oxide semiconductor layer 32 exposed from the U-shaped source electrode 25, the drain electrode 29, and the channel protection film 30 are removed to form the semiconductor layer 28.

The partial removal of the oxide semiconductor layer 32 is performed by wet etching using oxalic acid, for example. By this removal, the side faces of the semiconductor layer 28 become flush with part of the side faces of the U-shaped source electrode 25, the drain electrode 29, and the channel protection film 30, constituting the same plane.

Thereafter, $SiN_x$ is deposited to a thickness of about 250 nm by CVD to cover the semiconductor layer 28, the source electrode 25, the drain electrode 29, and the channel protection film 30, to form an interlayer insulating film 31 as a protection film. In this way, the TFT 10 is fabricated.

-Effect of Embodiment 2-

As described above, in Embodiment 2, while the semiconductor layer 28 of the TFT 10 having the U-shaped source electrode 25 is made of an oxide semiconductor such as IGZO excellent in electron mobility, etc., such a semiconductor layer 28 is formed to lie under the the source electrode 25, the drain electrode 29, and the channel protection film 30 so as not to protrude therefrom. Therefore, the semiconductor layer 28 is avoided from having a conductive portion altered from the oxide semiconductor layer 32 due to the reduction action, and thus occurrence of a leakage current can be significantly reduced. Moreover, with the source electrode 25 formed into a U shape, the channel width of the semiconductor layer 28 can be increased.

<Embodiment 3>

Figure 22:
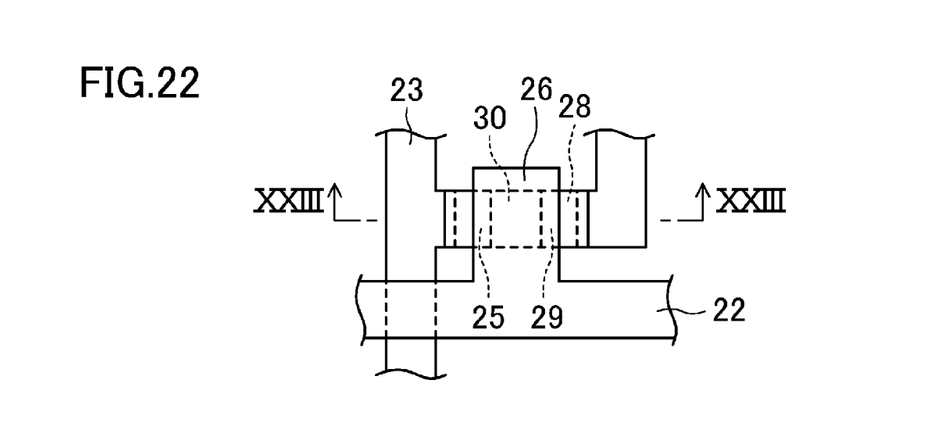
FIG. 22 is an enlarged plan view showing a TFT in Embodiment 3.
Figure 23:
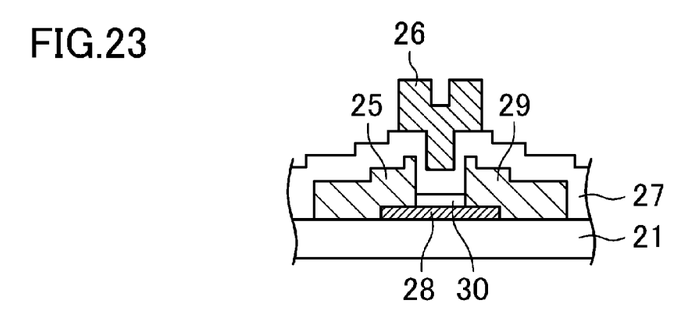
FIG. 23 is a cross-sectional view taken along line XXIII-XXIII in FIG. 22.
Figure 24:
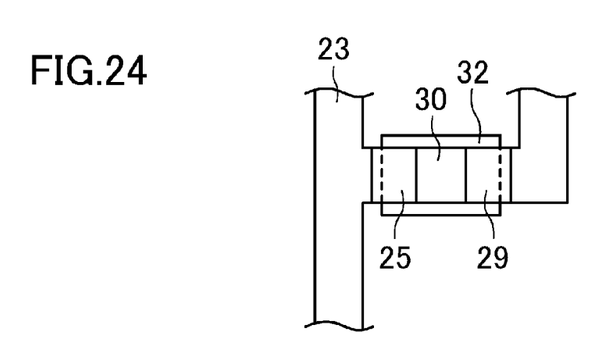
FIG. 24 is a plan view showing a source electrode and a drain electrode covering part of an oxide semiconductor layer.

FIGS. 22 to 24 show Embodiment 3 of the present invention.

FIG. 22 is an enlarged plan view showing a TFT 10 in Embodiment 3, FIG. 23 is a cross-sectional view taken along line XXIII-XXIII in FIG. 22, and FIG. 24 is a plan view showing a source electrode 25 and a drain electrode 29 covering part of an oxide semiconductor layer 32.

Embodiment 3 is different from Embodiment 1 in that, while the TFT 10 in Embodiment 1 is a bottom-gate type TFT, the TFT 10 in this embodiment is a top-gate type TFT.

The TFT 10 in this embodiment is formed in a TFT substrate 13 constituting a liquid crystal display panel 11, as in Embodiment 1. As shown in FIGS. 22 and 23, a semiconductor layer 28 is formed in a rectangular island shape on the surface of a glass substrate 21. On the surface of the semiconductor layer 28, also, a channel protection film 30 as the insulating film is formed to lie on part of the semiconductor layer 28. The channel protection film 30 is formed of $SiN_x$, $SiO_2$, or the like.

On the semiconductor layer 28, the source electrode 25 and the drain electrode 29 are formed to overlap the semiconductor layer 28. The channel protection film 30 is placed between the source electrode 25 and the drain electrode 29.

As shown in FIGS. 22 and 23, the entirety of the semiconductor layer 28 underlies any of the source electrode 25, the drain electrode 29, and the channel protection film 30.

In other words, as shown in FIG. 22, the semiconductor layer 28 is formed not to protrude from the source electrode 25, the drain electrode 29, and the channel protection film 30. Also, the side faces of part of the semiconductor layer 28 are flush with part of the side faces of the source electrode 25, the drain electrode 29, and the channel protection film 30, constituting one plane.

A gate insulating film 27 is formed to cover the channel protection film 30, the source electrode 25 and the drain electrode 29. The gate insulating film 27 is formed of a single-layer film made of one kind, or a multilayer film made of a plurality of kinds, selected from $SiN_x$, $SiO_2$, etc., for example.

A gate electrode 26 and a gate interconnect 22 are formed on the surface of the gate insulating film 27. The gate electrode 26 and the gate interconnect 22 are formed of a single-layer film made of one kind, or a multilayer film made of a plurality of kinds, selected from Al, Cu, Mo, Ti, etc., for example. These gate electrode 26, channel protection film 30, source electrode 25, drain electrode 29, etc. are covered with an interlayer insulating film (illustration omitted) as a protection film. The interlayer insulating film is formed of $SiN_x$, etc., for example.

-Fabrication Method-

Next, the fabrication method for the above-described TFT 10 and the liquid crystal display apparatus 1 will be described.

As in Embodiment 1 described above, the liquid crystal display apparatus 1 is fabricated in the following manner: a TFT substrate 13 fabricated by forming a plurality of TFTs 10, etc. and a counter substrate 14 fabricated by forming a common electrode, etc. are bonded together via a liquid crystal layer 15 and a sealing member 16, to fabricate a liquid crystal display panel 11, and a backlight unit 12 is opposed to the resultant liquid crystal display panel 11.

In fabrication of the TFT 10, in the first step, the island-shaped oxide semiconductor layer 32 partly covered with the channel protection film 30 is formed. That is, first, an oxide semiconductor layer (illustration omitted) made of IGZO, for example, is formed on the entirety of a glass substrate 21 as a transparent substrate to a thickness of about 50 nm by sputtering. Subsequently, an insulating material layer (illustration omitted) made of $SiO_2$, for example, is formed on the surface of the oxide semiconductor layer to a thickness of about 200 nm by CVD. Thereafter, the insulating material layer is subjected to a photolithography process and an etching process to form the channel protection film 30 having a predetermined shape. The channel protection film 30 is formed into a rectangular shape, for example, and placed to lie in the center of an area in which the gate interconnect 22 is to be formed.

Thereafter, as shown in FIG. 24, the oxide semiconductor layer is subjected to a photolithography process and an etching process to form the island-shaped oxide semiconductor layer 32. The oxide semiconductor layer 32 is formed into a rectangular shape, for example, and also formed so that the channel protection film 30 sits on the center of the oxide semiconductor layer 32. In other words, at this time, the oxide semiconductor layer 32 protrudes from the periphery of the channel protection film 30.

In the second step, a conductive material layer (illustration omitted) is formed to cover the oxide semiconductor layer 32 and the channel protection film 30. The conductive material layer is formed by stacking a Ti layer as a lower layer (illustration omitted) having a thickness of about 100 nm and then an Al layer as an upper layer (illustration omitted) having a thickness of about 300 nm, for example. Note that the conductive material layer may be formed of a single-layer film made of one kind, or a multilayer film made of a plurality of kinds, selected from Al, Cu, Mo, Ti, etc., for example.

In the third step, as shown in FIG. 24, the conductive material layer is subjected to a photolithography process and a plasma dry etching process to form the source interconnect 23, the source electrode 25, and the drain electrode 29 from the conductive material layer, whereby part of the oxide semiconductor layer 32 is exposed from the source electrode 25, the drain electrode 29, and the channel protection film 30.

The source electrode 25 and the drain electrode 29 are formed so that the width of the oxide semiconductor layer 32 in the direction orthogonal to the direction in which the source electrode 25 and the drain electrode 29 face each other (i.e., the vertical direction in FIG. 24) is larger than the width of the source electrode 25 and the drain electrode 29 and the width of the channel protection film 30.

The reason why part of the oxide semiconductor layer 32 is exposed from the source electrode 25, the drain electrode 29, and the channel protection film 30 is that the oxide semiconductor layer 32 is formed wider beforehand to secure a superposition margin between the oxide semiconductor layer 32 and the source and drain electrodes 25 and 29. The exposed portions of the oxide semiconductor layer 32 are rendered conductive due to the reduction action in the plasma treatment in the above plasma dry etching process.

In the fourth step, as shown in FIG. 22, the portions of the oxide semiconductor layer 32 exposed from the source electrode 25, the drain electrode 29, and the channel protection film 30 are removed to form the semiconductor layer 28.

The partial removal of the oxide semiconductor layer 32 is performed by wet etching using oxalic acid, for example. By this removal, the sides of the semiconductor layer 28 become flush with part of the side faces of the source electrode 25, the drain electrode 29, and the channel protection film 30, constituting the same plane.

Subsequently, an $SiO_2$ film, for example, is formed on the glass substrate 21 to a thickness of about 350 nm by CVD to cover the source electrode 25, the drain electrode 29, and the channel protection film 30, thereby forming the gate insulating film 27. The gate insulating film 27 is not limited to the $SiO_2$ film, but may be formed of a single-layer film made of one kind, or a multilayer film made of a plurality of kinds, selected from $SiN_x$ (silicon nitride), $SiO_2$, etc., for example.

Thereafter, a conductive material layer (not shown) made of Mo, for example, is formed uniformly on the surface of the gate insulating film 27, and then subjected to a photolithography process and an etching process, thereby forming the gate interconnect 22 and the gate electrode 26 as shown in FIGS. 22 and 23. The gate electrode 26 is formed to stride the semiconductor layer 26.

The conductive material layer is not limited to a single layer of Mo, but may be a single-layer film made of one kind, or a multilayer film made of a plurality of kinds, selected from Al, Cu, Mo, Ti, etc., for example.

Thereafter, $SiN_x$ is deposited to a thickness of about 250 nm by CVD to cover the semiconductor layer 28, the source electrode 25, the drain electrode 29, and the channel protection film 30, to form the interlayer insulating film (illustration omitted) as a protection film. In this way, the TFT 10 is fabricated.

-Effect of Embodiment 3-

As described above, in Embodiment 3, while the semiconductor layer 28 constituting the top-gate type TFT 10 is made of an oxide semiconductor such as IGZO excellent in electron mobility, etc., such a semiconductor layer 28 is formed to lie under the the source electrode 25, the drain electrode 29, and the channel protection film 30 so as not to protrude therefrom. Therefore, the semiconductor layer 28 is avoided from having a conductive portion altered from the oxide semiconductor layer 32 due to the reduction action, and thus occurrence of a leakage current can be significantly reduced.

<Other Embodiments>

In the above embodiments, described were the examples where the oxide semiconductor layer 32 having a predetermined shape was formed from the oxide semiconductor layer 33 formed uniformly on the substrate, and then part of the oxide semiconductor layer 32 was removed after formation of the source electrode 25, the drain electrode 29, etc. The present disclosure is not limited to this, but the source electrode 25, the drain electrode 29, etc. may be formed on the oxide semiconductor layer 33 formed uniformly on the substrate, and then part of the oxide semiconductor layer 33 may be removed by etching using such a source electrode 25, etc. as a mask, to form the semiconductor layer 28. With this method, permitting direct formation of the semiconductor layer 28 from the oxide semiconductor layer 33, the number of process steps can be considerably reduced.

In the above embodiments, the TFT was described as an example of the semiconductor device. The present disclosure is not limited to this, but is also applicable to other types of semiconductor devices such as a thin film diode (TFD) having the semiconductor layer 28 made of the oxide semiconductor described above, for example. In the above embodiments, the liquid crystal display apparatus was described as an example of the display apparatus. The present disclosure is not limited to this, but is also applicable to other types of display apparatuses such as an organic EL display apparatus, for example.

The present disclosure is not limited to Embodiments 1 to 3 described above, but also includes configurations obtained by appropriately combining Embodiments 1 to 3.

Industrial Applicability

As described above, the present disclosure is useful for a semiconductor device, a fabrication method therefor, and a display apparatus.

DESCRIPTION OF REFERENCE CHARACTERS

1 Liquid Crystal Display Apparatus
10 TFT
11 Liquid Crystal Display Panel
13 TFT Substrate
16 Sealing Member
21 Glass Substrate
22 Gate Interconnect
23 Source Interconnect
25 Source Electrode (Electrode Portion)
26 Gate Electrode
27 Gate Insulating Film
28 Semiconductor Layer
28 Drain Electrode (Electrode Portion)
30 Channel Protection Film (Insulating Film)
31 Interlayer Insulating Film
32, 33 Oxide Semiconductor Layer

The invention claimed is:

1. A fabrication method for a semiconductor device, for fabricating a semiconductor device including a semiconductor layer, a plurality of electrode portions each overlapping the semiconductor layer, and an insulating film placed between the plurality of electrode portions to lie on the semiconductor layer, the method comprising:

a first step of forming an island-shaped oxide semiconductor layer part of which is covered with the insulating film;

a second step of forming a conductive material layer to cover the oxide semiconductor layer and the insulating film;

a third step of forming the plurality of electrode portions from the conductive material layer by photolithography and plasma dry etching, to expose part of the oxide semiconductor layer from the plurality of electrode portions and the insulating film; and a fourth step of removing the part of the oxide semiconductor layer exposed from the plurality of electrode portions and the insulating film to form the semiconductor layer.

2. The fabrication method for a semiconductor device of claim 1, wherein in the third step, the plurality of electrode portions are formed so that the width of the oxide semiconductor layer is larger than the width of the electrode portions and the width of the insulating film in a direction orthogonal to the direction in which the plurality of electrode portions face each other.

3. The fabrication method for a semiconductor device of claim 1, wherein the plurality of electrode portions are a source electrode and a drain electrode, and the insulating film is a channel protection film.

4. The fabrication method for a semiconductor device of claim 1, wherein the oxide semiconductor is IGZO.

* * * * *